US005614421A

United States Patent [19]
Yang

[11] Patent Number: 5,614,421
[45] Date of Patent: Mar. 25, 1997

[54] METHOD OF FABRICATING JUNCTION TERMINATION EXTENSION STRUCTURE FOR HIGH-VOLTAGE DIODE DEVICES

[75] Inventor: Sheng-Hsing Yang, Hsinchu, Taiwan

[73] Assignee: United Microelectronics Corp., Hsinchu, Taiwan

[21] Appl. No.: 364,611

[22] Filed: Dec. 27, 1994

Related U.S. Application Data

[63] Continuation-in-part of Ser. No. 212,429, Mar. 11, 1994, Pat. No. 5,401,682.

[51] Int. Cl.$^6$ .................................................. H01L 21/76
[52] U.S. Cl. ........................... 437/24; 437/69; 437/904
[58] Field of Search ........................... 437/24, 904, 69, 437/61; 257/630, 508; 148/DIG. 17, DIG. 85, DIG. 86

[56] References Cited

U.S. PATENT DOCUMENTS

| | | |
|---|---|---|
| 4,646,426 | 3/1987 | Sasaki . |
| 4,743,563 | 5/1988 | Pfiester et al. ............................ 437/24 |
| 4,755,480 | 7/1988 | Yau et al. . |
| 4,904,614 | 2/1990 | Fisher et al. . |
| 5,215,934 | 6/1993 | Tzeng ....................................... 437/24 |
| 5,286,985 | 2/1994 | Taddiken . |
| 5,286,998 | 2/1994 | Ema . |
| 5,369,052 | 11/1994 | Kenkare et al. .......................... 437/69 |

OTHER PUBLICATIONS

"Increased Avalanche Breakdown Voltage and Controlled Surface Electric Fields Using a Junction Termination Extension (JTE) Technique", by Victor A.K. Temple, 1983, IEEE, pp. 954–957.
"Influence of Interconnections onto the Breakdown Voltage of Planar High–Voltage p-n Junctions", by Falck, et al; 1993, IEEE, pp. 439–447.

*Primary Examiner*—George Fourson
*Assistant Examiner*—Scott Kirkpatrick
*Attorney, Agent, or Firm*—Ladas & Parry

[57] ABSTRACT

A method of fabricating high-voltage diode device on a silicon substrate which includes a first region and a second region is provided. The first and second regions having a first contact and a second contact area respectively. First, a first protective layer is formed on the first and second contact areas. A second protective layer is formed on the first protective layer and a portion of the first region adjacent to the first contact area. Next, Halogen ions are implanted into the first and second regions by using the second protective layer as a mask. The second protective layer is removed to expose unimplanted portion of the first region. Then, the first and second regions are oxidized to form a field oxide layer by using the first protective layer as a mask, wherein the unimplanted portion of the first region has a relatively lower oxidation rate and thereby a stepped part of the field oxide layer is formed over the first region. After removing the first protective layer, a first electrode plate is formed on the first contact area and the stepped part of the field oxide layer. A dielectric layer is formed overlying the first electrode plate and the field oxide layer. Finally, a second electrode plate is formed on the second contact area and the dielectric layer, completing the fabrication of high-voltage diode device.

6 Claims, 5 Drawing Sheets

METHOD OF FABRICATING JUNCTION TERMINATION EXTENSION STRUCTURE FOR HIGH-VOLTAGE DIODE DEVICES

CROSS-REFERENCE TO RELATED APPLICATION

This is a continuation-in-part of an application entitled "Method of Fabrication High Voltage Junction Termination Extension Structure for a Semiconductor Integrated Circuit Device and the Resulting Device Structure", Ser. No. 08/212,429, which was filed on Mar. 11, 1994, and which is assigned to the assignee of the present invention, now U.S. Pat. No. 5,401,682.

BACKGROUND OF THE INVENTION

1. Field of the Invention

The present invention relates in general to a method of manufacturing high-voltage semiconductor integrated circuit devices. More particularly, this invention relates to a method of manufacturing a junction termination extension (JTE) structure for high-voltage diode devices.

2. Technical Background

High-voltage integrated circuit devices have been widely utilized in the fields of communications and electric machine control, as well as in power supplies and consumer electronics. More widespread utilization of these devices is expected in other fields in the future.

One problem with conventional high-voltage integrated circuit devices is an excessive electric field intensity produced in a region near the reverse-biased P-N junction area. Several measures have been employed in the past to cope with this problem. One of them is the so-called junction termination extension (JTE) technique described in "Increased Avalanche Breakdown Voltage and Controlled Surface Electric Fields Using a Junction Termination Extension (JTE) Technique" by V. A. K. Temple, *IEEE Transactions on Electron Devices*, Vol. ED-30, pp. 954–957, 1983, the disclosure of which is hereby incorporated herein by reference. This technique has been shown to be able to effectively block against the effects of the electric field, even though in a traverse direction the reverse-biased space-charge region is constrained.

Another related problem, however, should also be considered, namely, the excessive electric field intensity present in the region where the metal interconnection strides the space-charge region. The effect of the metal interconnection on the electric field is dependent upon its distance to the silicon substrate beneath it. Typically, there is an oxide layer present between the metal interconnection and the substrate, with the oxide layer having a thickness of approximately 3–5 μm.

Referring first to FIG. 1, a prior art junction termination extension (JTE) structure, in the form of a diode having high-voltage metal interconnection, is shown. There is a stage-shaped field plate 102 formed on anode 10. The typical length of the field plate 102 is approximately 10 μm, and the distance between field plate 102 and silicon substrate 14 is approximately 1 μm (To emphasize the stage-shaped field plate 102, the figure is not drawn to scale). A $P^+$ region 16 is in contact with anode 10. Adjacent $P^+$ region 16 is a lightly doped $P^-$ layer 18. Cathode 12 has a high-voltage metal interconnection 122 which extends parallel to silicon substrate 14 and is spaced therefrom a distance of approximately 3–5 μm. An $N^+$ region 20 is in contact with cathode 12. Field plate 102 and the metal interconnection 122 are separated from the surface of silicon substrate 14 by a silicon dioxide layer 22.

Due to the fact that metal interconnection 122 carries a high voltage and is disposed above field plate 102, a high intensity electric field occurs at the surface of the silicon substrate 14 in a region below the edge of field plate 102, which region is indicated by arrow 24. The breakdown voltage of the device is severely degraded as a result of the presence of this high intensity electric field, especially in the case when the thickness of the oxide layer below the field plate 102 ands the thickness of the oxide layer below the metal interconnection 122 are both small. Obviously, the smaller the thickness, the greater the degradation of the avalanche breakdown voltage. More detailed descriptions of this phenomena can be found in the paper "Influence of Interconnections onto the Breakdown Voltage of Planar High-Voltage P-N Junctions" by E. Falck et al., *IEEE Transactions on Electron Devices*, Vol. 40, No. 2, pp. 439–447, 1993, the disclosure of which is hereby incorporated by reference.

SUMMARY OF THE INVENTION

The object of the invention, therefore, is to provide a method of fabricating a junction termination extension structure for a high-voltage device that solves the problem of low breakdown voltage noted above.

In accordance with the object of the present invention, a method of fabricating high-voltage device on a silicon substrate which includes a first region and a second region is provided. The first and second regions have respective first contact and second contact areas. A first protective layer is formed on the first and second contact areas. Then a second protective layer is formed on the first protective layer and on a portion of the first region adjacent to the first contact area. Next, halogen ions are implanted into the first and second regions using the second protective layer as a mask. The second protective layer is removed to expose a unimplanted-with-halogen portion of the first region. Then, the first and second regions are oxidized to form a field oxide layer by using the first protective layer as a mask, wherein the unimplanted-with-halogen portion of the first region has a relatively lower oxidation rate and thereby a stepped configuration or portion in the field oxide layer is formed over the first region. After removing the first protective layer, a first electrode plate is formed in ohmic contact with the first contact area and on the stepped part of the field oxide layer. A dielectric layer is formed overlying the first electrode plate and the field oxide layer. Finally, a second electrode plate is formed in ohmic contact with the second contact area and over the dielectric layer, completing the fabrication of high-voltage device.

BRIEF DESCRIPTION OF THE DRAWING

Other objects, features and advantages of the present invention will become apparent by the following detailed description of the preferred, but non-limiting embodiment, with reference to the accompanied drawings, wherein.

DETAILED DESCRIPTION OF THE PREFERRED EMBODIMENTS

A first preferred embodiment of the present invention will now be described. A junction termination extension structure for high-voltage diode devices in accordance with the present invention can be fabricated by a process which will be described sequentially with reference to FIGS. 2A to 2G.

Figure 1:
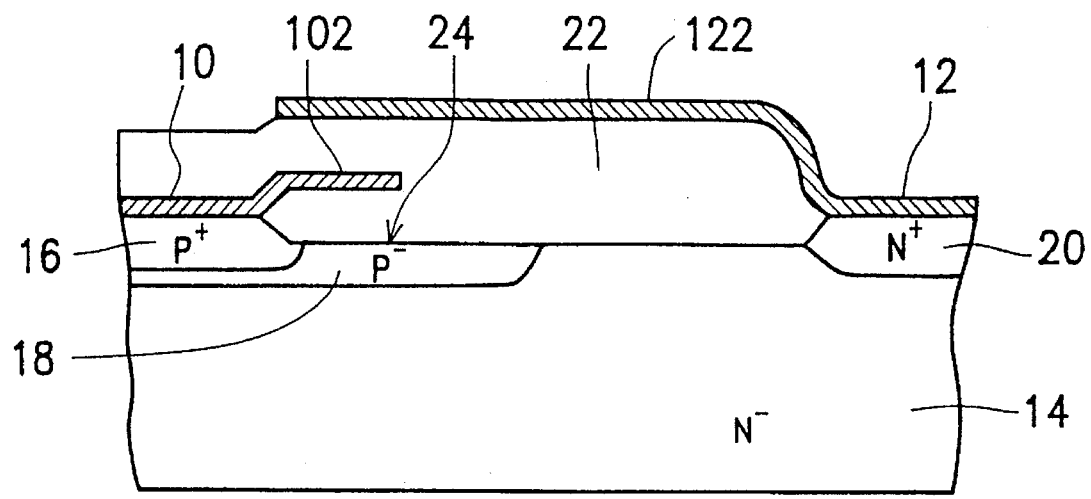
FIG. 1 is a diagram showing a cross section of the structure of a prior art junction termination extension diode having high voltage metal interconnection.
Figure 2A:
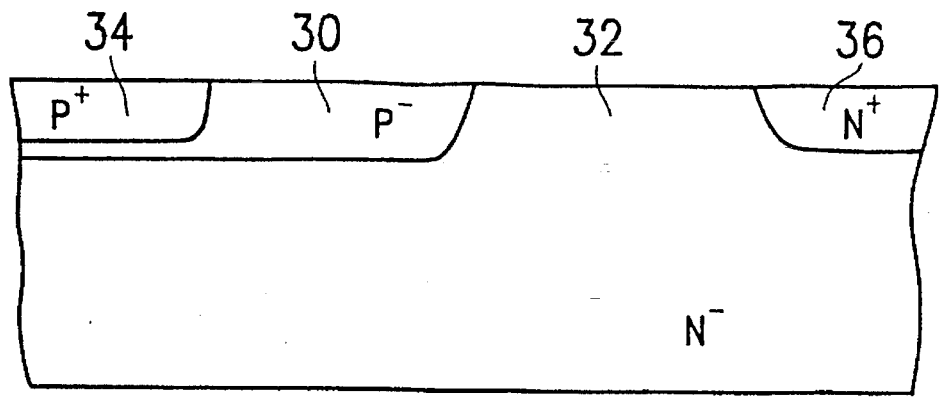
FIGS. 2A to 2G illustrate a junction termination extension structure in accordance with a first preferred embodiment of the present invention in the stages of the process steps of fabrication.

Referring to FIG. 2A, there is shown a semiconductor substrate which includes a first region 30 of a first conductivity type and a second region 32 of a second conductivity type. The first region 30 and the second region 32 have a first contact area 34 of the first conductivity type and a second contact area 36 of the second conductivity type, respectively. In the present embodiment, to form the above mentioned structure, an $N^-$ type silicon substrate 32, which acts as the second region, is provided with a thin oxide layer (not shown, but conventionally used). A photoresist layer is applied on the substrate and patterned, using conventional lithography techniques, leaving an area to be implanted, for forming the $P^-$ layer 30, exposed. After implanting layer 30, the aforementioned photoresist is removed. A similar process is used to implant a $P^+$ region 34, i.e., a photoresist layer is applied on the substrate and patterned leaving exposed the area to be implanted. After implanting layer 34, the photoresist layer is then removed. The same sequence of process steps is repeated a third time to form an $N^+$ region 36, i.e., by applying a photoresist layer on the substrate, patterning it, and exposing the desired $N^+$ region to implantation and then removing the photoresist. After the third photoresist layer is removed, the thin layer of oxide is also removed to provide a structure as is shown in FIG. 2A.

Figure 2B:
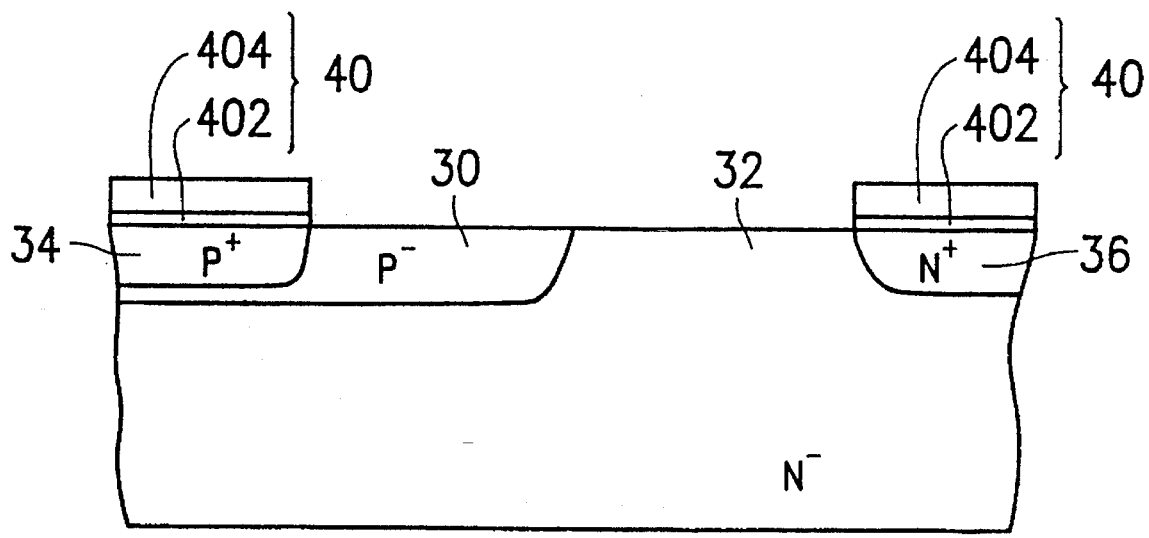

The process continues as will now be described with reference to FIG. 2B. A first protective layer 40 is formed on the first and second contact areas 34 and 36. This may be accomplished by first forming a pad oxide layer 402 on the substrate by thermal oxidation or chemical vapor deposition (CVD). A silicon nitride layer 404 is then deposited on the pad oxide layer 402. Then, the silicon nitride layer 404 and the pad oxide layer 402 are patterned to expose the first and the second regions 30 and 32, using conventional lithography and etching processes.

Figure 2C:
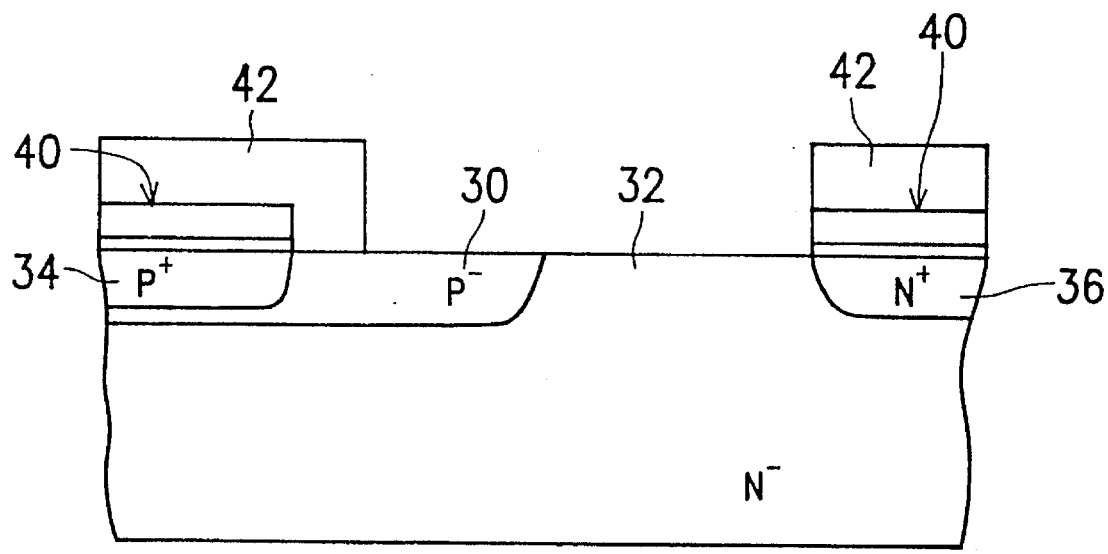

Turning now to FIG. 2C, a second protective layer 42 is formed on the first protective layer 40 and on a portion of the first region 30 adjacent to the first contact area 34. This may be accomplished by coating and patterning a layer of photoresist to form the second protective layer 42. Then, using the second protective layer 42 as a mask, halogen ions, such as fluorine or chlorine ions, are implanted into the first and second regions 30 and 32. The implantation of halogen ions into the substrate will improve the oxidation rate during a subsequent oxidation procedure. After the halogen implantation, the second protective layer 42 is removed to expose the remaining non-halogen-implanted portion of first region 30 by a appropriate solvent.

Figure 2D:
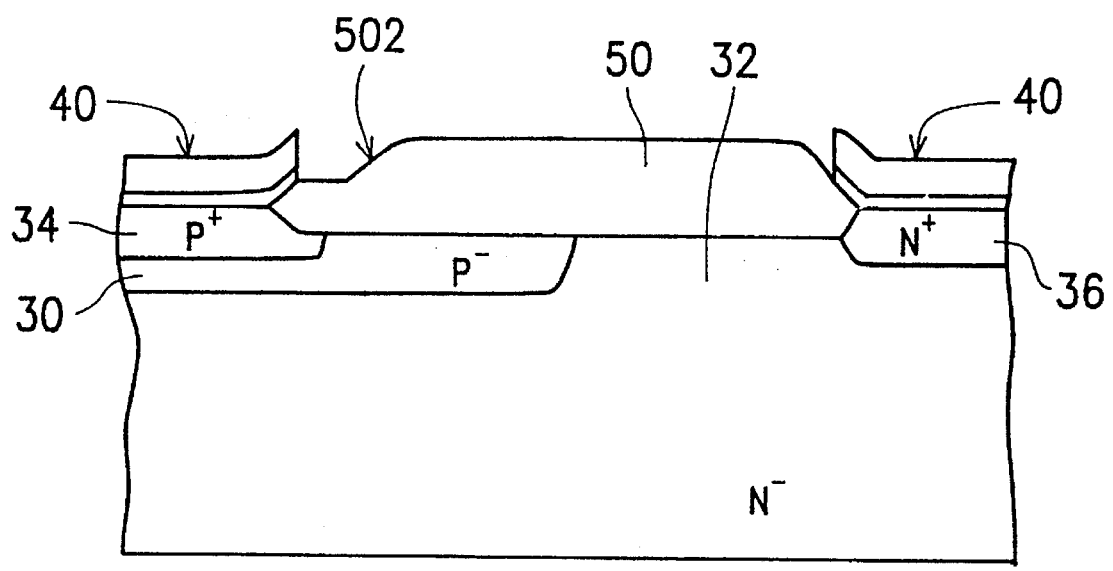
Figure 2E:
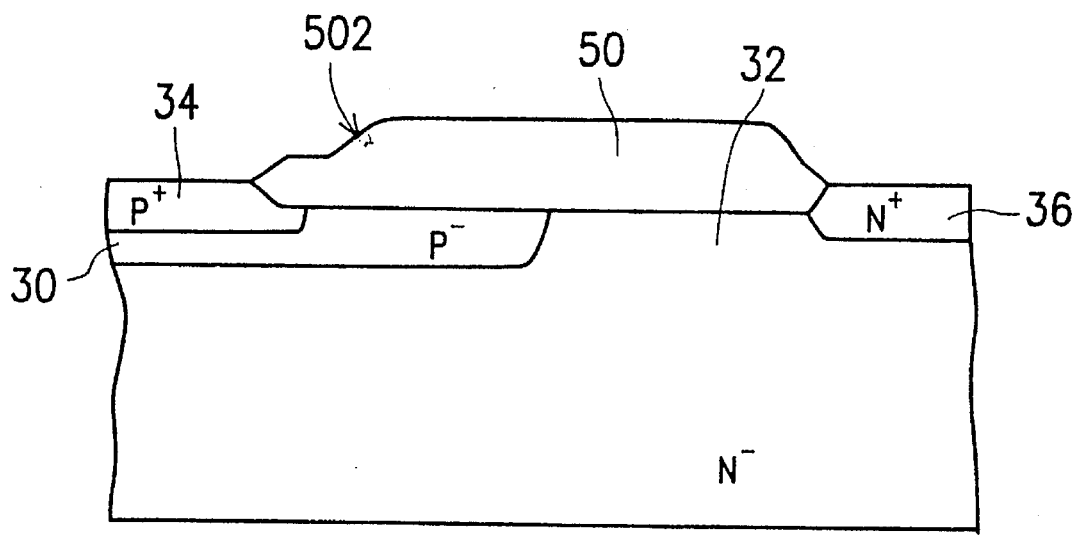

As shown in FIG. 2D, the exposed first and second regions 30 and 32 are oxidized to form a field oxide layer 50 by using the first protective layer 40 as a mask. Since the unimplanted portion of the first region 30 has a relatively lower oxidation rate compared to that of the halogen-implanted portions of first and second regions 30 and 32, a stepped configuration 502 in field oxide layer 50 forms over the first region 30 since field oxide 50 is thicker over the halogen-implanted region than it is over the non-halogen-implanted region. After the oxidation procedure, the first protective layer 40 is removed, as is shown in FIG. 2E. For example, the silicon nitride layer 404 may be etched in hot phosphoric acid solution while the pad oxide layer 402 may be etched in an HF solution.

Figure 2F:
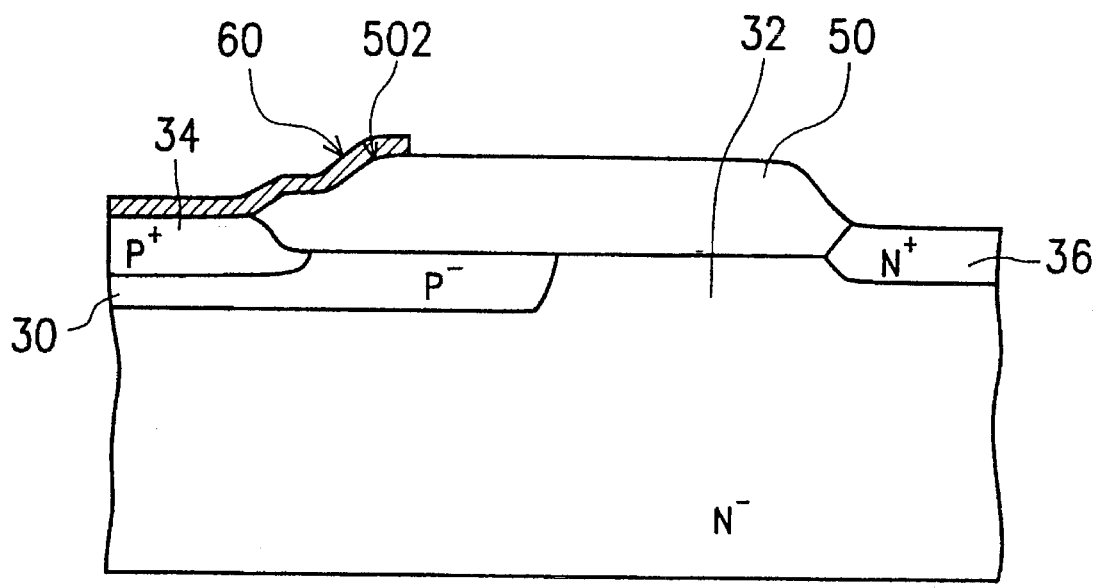

Turning now to FIG. 2F, a first electrode plate 60 is formed on the first contact area 34 and on the stepped portion 502 of field oxide layer 50. For example, a first layer of metal is deposited preferably by sputtering. Then, the first layer of metal is patterned using conventional lithography and etching processes to define the first electrode plate 60 which covers first contact area 34 and stepped portion 502 of field oxide layer 50. After the first electrode plate 60 is defined, the photoresist is removed.

Figure 2G:
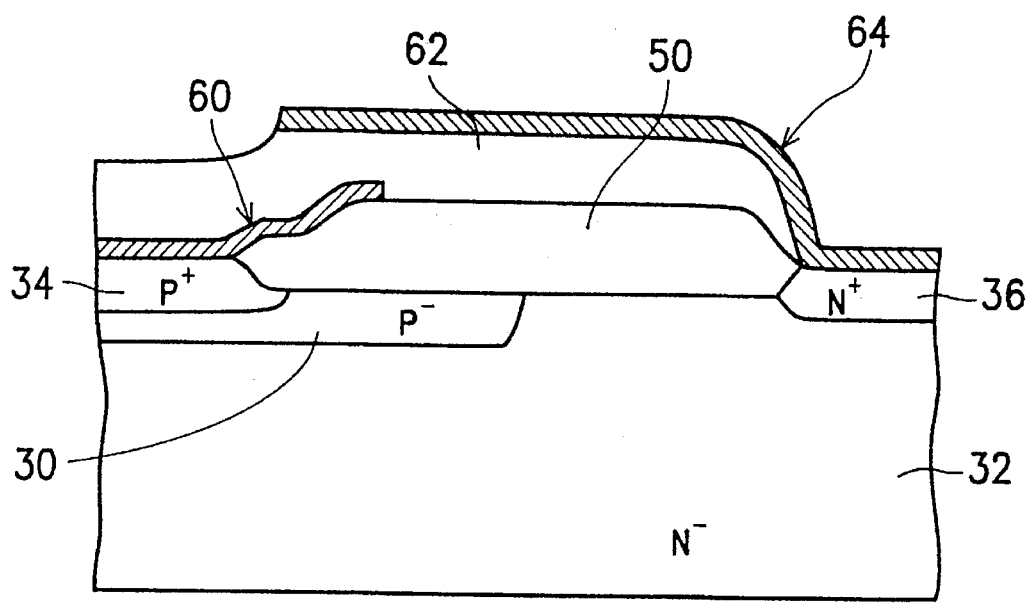

Then, as shown in FIG. 2G, a dielectric layer 62 is formed overlying the first electrode plate 60 and the field oxide layer 50. This may be accomplished by forming a silicon dioxide layer, preferably by CVD, and patterning it by conventional lithography and etching processes to form the dielectric layer 62. Finally, a second electrode plate 64 is formed on second contact area 36 and on dielectric layer 62. Second electrode plate is preferably formed by depositing a second layer of metal, preferably by sputtering, and then the second layer of metal is patterned using conventional lithography and etching processes to define the second electrode plate 64, which plate contacts second contact area 36 and is disposed over dielectric layer 62.

In accordance with the present invention, since portions of first and second regions 30 and 32 are implanted with halogen ions which improve the oxidation rate, the field oxide layer 50 is formed over the first region 30 with stepped portion 502 at or near the boundary between the halogen-implanted region and the non-halogen-implanted region. The distance between the edge of the first electrode plate 60 and the surface of the silicon substrate 30 can be increased as desired. This can result in a reduction of the electric field intensity there between and the breakdown voltage can therefore be raised to increase the reliability of the high-voltage diode device.

Figure 3:
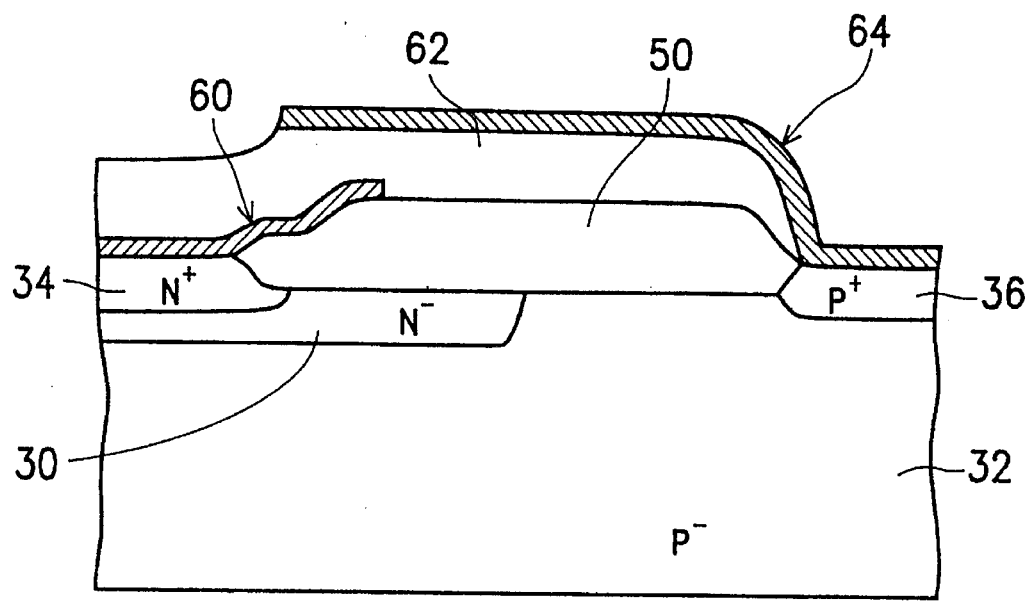
FIG. 3 illustrates a junction termination extension structure in accordance with a second preferred embodiment of the present invention.

FIG. 3 shows another possible structure of the high-voltage diode device fabricated by the method of the present invention. Those skilled in the art will appreciate that all of the process steps are substantially the same as those described with reference to the first preferred embodiment, except that the high-voltage diode device is formed on a $P^-$ type silicon substrate 32 (which also acts as the second region) with an $N^-$ type first region 30. Accordingly, an $N^+$ type first contact area 34 is formed in the $N^-$ type first region 30, and a $P^+$ type second contact area 36 is formed in the $P^-$ type second region 32.

While the invention has been described by way of two embodiments, it is to be understood that the invention is not be limited to the disclosed embodiments. On the contrary, modification may suggest itself to those skilled in the art and it is intended that the present invention cover various modifications and similar arrangements included within the spirit and scope of the appended claims, the scope of which should be accorded the broadest interpretation so as to encompass all such modifications and similar structures.

I claim:

1. A method of fabricating diode device on a silicon substrate including a first region of a first conductivity type and a second region of a second conductivity type, said first region and said second region having a first contact area of the first conductivity type and a second contact area of the second conductivity type respectively, said method comprising the steps of:

forming a first protective layer on the surface of said first and second contact areas;

forming a second protective layer on said first protective layer and a portion of said first region adjacent to said first contact area;

implanting halogen ions into said first and second regions by using said second protective layer as a mask;

removing said second protective layer to expose an unimplanted portion of said first region;

oxidizing said first and second regions to form a field oxide layer by using said first protective layer as a mask, wherein the unimplanted portion of said first region has a relatively lower oxidation rate and whereby said field oxide layer is formed with a stepped configuration therein;

removing said first protective layer;

forming a first electrode plate which is electrically coupled to said first contact area and over the stepped configuration of said field oxide layer;

forming a dielectric layer overlying said first electrode plate and said field oxide layer; and forming a second electrode plate which is electrically coupled with said second contact area and over said dielectric layer, wherein said second electrode plate extends above said first electrode plate.

2. The method according to claim 1 wherein said first conductivity type is P-type conductivity, and said second conductivity type is N-type conductivity.

3. The method according to claim 1 wherein said first conductivity type is N-type conductivity, and said second conductivity type is P-type conductivity.

4. The method according to claim 1 wherein said first and second electrode plates are made of metal layer.

5. The method according to claim 1 wherein said first electrode plate contacts said first contact area and said second electrode plate contacts said second contact area.

6. A method of fabricating high-voltage semiconductor device on a silicon substrate including a first region of a first conductivity type and a second region of a second conductivity type, said method comprising the steps of:

implanting halogen ions into said first and second regions by using a protective layer as a mask to form a halogen implanted region and leaving at least a portion of said first region substantially unimplanted with halogen ions;

oxidizing said first and second regions to form a field oxide layer, whereby said field oxide layer is formed with a stepped configuration therein between said halogen implanted region and said unimplanted region;

forming a first electrode plate over the stepped configuration of said field oxide layer;

forming a dielectric layer overlying said first electrode plate and said field oxide layer; and forming a second electrode plate over said dielectric layer, wherein said second electrode plate extends above said first electrode plate.

* * * * *